United States Patent
Percival et al.

(10) Patent No.: US 10,712,579 B1
(45) Date of Patent: Jul. 14, 2020

(54) VORTEX LINEARIZATION OF MICRO-LED POLARIZATION

(71) Applicant: Facebook Technologies, LLC, Menlo Park, CA (US)

(72) Inventors: Christopher Percival, Blarney (IE); Yijing Fu, Redmond, WA (US)

(73) Assignee: Facebook Technologies, LLC, Menlo Park, CA (US)

( * ) Notice: Subject to any disclaimer, the term of this patent is extended or adjusted under 35 U.S.C. 154(b) by 4 days.

(21) Appl. No.: 16/134,785

(22) Filed: Sep. 18, 2018

Related U.S. Application Data (60) Provisional application No. 62/561,161, filed on Sep. 20, 2017.

(51) Int. Cl.
| | | |
|---|---|---|
| G02B 27/28 | (2006.01) | |
| H01L 25/075 | (2006.01) | |
| H01L 33/24 | (2010.01) | |
| H01L 33/58 | (2010.01) | |
| H01L 33/10 | (2010.01) | |

(52) U.S. Cl.
CPC ........ *G02B 27/286* (2013.01); *H01L 25/0753* (2013.01); *H01L 33/10* (2013.01); *H01L 33/24* (2013.01); *H01L 33/58* (2013.01); *H01L 2933/0058* (2013.01)

(58) Field of Classification Search
CPC ....... G02B 27/286; H01L 33/58; H01L 33/24; H01L 28/0753
See application file for complete search history.

(56) References Cited

U.S. PATENT DOCUMENTS

| | | | | |
|---|---|---|---|---|
| 7,518,149 B2* | 4/2009 | Maaskant | ....... | H01L 31/035281 257/79 |
| 9,515,238 B2* | 12/2016 | Maaskant | ............... | H01L 33/44 |
| 10,325,791 B1* | 6/2019 | Saketi | .................... | B65G 47/90 |
| 10,490,699 B2* | 11/2019 | Brennan | ............... | H01L 27/156 |
| 10,515,580 B2* | 12/2019 | Henry | .................... | H01L 33/62 |
| 10,542,596 B1* | 1/2020 | Talati | .................... | H05B 45/37 |
| 2010/0060553 A1* | 3/2010 | Zimmerman | ....... | H01L 25/0753 345/60 |
| 2015/0179904 A1* | 6/2015 | Maaskant | ............... | H01L 33/64 257/98 |
| 2015/0236201 A1* | 8/2015 | Shepherd | .......... | H01L 31/02327 257/88 |
| 2015/0325746 A1* | 11/2015 | Percival | ................ | H01L 27/156 257/76 |
| 2017/0025469 A1* | 1/2017 | Percival | ................ | H01L 27/156 |
| 2017/0123526 A1* | 5/2017 | Trail | .................. | G06K 9/00617 |
| 2017/0373228 A1* | 12/2017 | Chang | .................... | H01L 33/20 |
| 2019/0013438 A1* | 1/2019 | Brennan | ................. | H01L 33/10 |
| 2019/0086669 A1* | 3/2019 | Percival | ............. | H01L 25/0753 |

* cited by examiner

*Primary Examiner* — Joseph C. Nicely
(74) *Attorney, Agent, or Firm* — Fenwick & West LLP (57) ABSTRACT

A vortex polarizer converts light having azimuthal polarization emitted at a light emitting surface of a light emitting diode (LED) into a converted light having linear polarization. The vortex polarizer includes a distribution of fast axes that vary as a function of azimuth angle. Each fast axis rotates a portion of the light having the azimuthal polarization to a portion of the converted light having linear polarization. The vortex polarizer may include linear photoalignment polymer (LPP) aligned to define the distribution of fast axes.

15 Claims, 9 Drawing Sheets

Fabricate a LED on a semiconductor
substrate
905

Deposit a photo-alignment liquid crystal (LC) material
including a linear photo-alignment polymer (LPP) on a light
emitting surface of the LED
910

Align the LPP of the photo-alignment LC material on the light
emitting surface of the LED to form a distribution of fast axes
of a vortex polarizer
915

VORTEX LINEARIZATION OF MICRO-LED POLARIZATION

CROSS REFERENCE TO RELATED APPLICATION

This application claims the benefit under 35 U.S.C. § 119(e) to U.S. Provisional Application No. 62/561,161, titled "Vortex Linearization of Micro-LED Polarization," filed Sep. 20, 2017, which is incorporated by reference in its entirety.

BACKGROUND

The present disclosure generally relates to display panels, and specifically to display panels that output polarized light in head-mounted displays (HMDs).

A HMD, such as for a virtual reality (VR) system, typically includes an electronic display that emits light to the eyes of the viewer, and an optical block positioned between the display and the eyes. The optical block includes optical components that receive light emitted from the electronic display, and adjust an orientation of the light such that the electronic display appears at one or more particular focal distances from the user. Light emitting devices, such as light emitting diodes (LEDs), are used in electronic display panels to emit light for image production. The quality and efficiency of light interaction (e.g., coupling) with the optical block can depend on the polarization of the light emitted from the light emitting devices relative to the optical properties of the optical components.

SUMMARY

Embodiments relate to a light emitting device having a light emitting surface and a vortex polarizer disposed on the light emitting surface. The vortex polarizer converts light having azimuthal polarization emitted at the light emitting surface into a converted light having linear polarization. The light emitted from the light emitting surface may be quasi-collimated light having the azimuthal polarization. The vortex polarizer includes a distribution of fast axes that vary as a function of azimuth angle. Each fast axis rotates a portion of the light having the azimuthal polarization to a portion of the converted light having linear polarization.

In some embodiments, the vortex polarizer includes linear photoalignment polymer (LPP) aligned to define the distribution of fast axes. Each fast axis rotates the portion of the light having the azimuthal polarization based on an angle defined between the fast axis and an axis of orientation of the portion of light having azimuthal polarization In some embodiments, the light emitting device includes a substrate, an epitaxial layer, and an active layer. The substrate has a light emitting surface. The epitaxial layer is disposed on another surface of the substrate at an opposite side of the light emitting surface. At least a portion of the epitaxial layer shaped into a mesa structure protruding away from the light emitting surface. The active layer is disposed on the mesa structure to emit light having azimuthal polarization to the light emitting surface. At least a portion of the light from the active layer is internally reflected at the mesa structure towards the light emitting surface. The mesa structure collimates the light generated by the active layer when the light is reflected by the mesa structure. The collimated or quasi-collimated light has the azimuthal polarization, and the vortex polarizer converts the light having the azimuthal polarization into the converted light having the linear polarization.

Some embodiments may include a head-mounted display (HMD). The HMD includes an electronic display and a multifocal structure. The electronic display includes LEDs disposed on a display substrate. The LED includes a vortex polarizer to convert the light having azimuthal polarization emitted from a light emitting surface of the LED into converted light having the linear polarization. The multifocal structure includes a linear polarizer having a polarization axis aligned along an electric field component of the light having the linear polarization.

Some embodiments may include a method for manufacturing a light emitting device including a vortex polarizer. The vortex polarizer may be formed on a light emitting surface of the light emitting device via a linear photoalignment polymer (LPP) alignment process. The process may include aligning LPP disposed on the light emitting surface to form a distribution of fast axes of the vortex polarizer using laser interferometry or laser direct writing.

The figures depict embodiments of the present disclosure for purposes of illustration only.

DETAILED DESCRIPTION

Embodiments relate to converting azimuthal polarized light emitted from a microLED, having a collimated light output and small light emitting area, into a second polarization having efficient coupling with optical components, such as a linear polarization. In some embodiments, an HMD may include an electronic display including a display substrate and light emitting diodes (LEDs) disposed on the substrate. Each LED has a light emitting surface emitting light having azimuthal polarization, and a vortex polarizer disposed on the light emitting surface. In some embodiments, the LEDs may be microLEDs having the collimated light output and small light emitting area. The vortex polarizer converts the light emitted from the light emitting layer to a converted light having linear polarization. The HMD may also include a multifocal structure positioned to receive the converted light having the linear polarization from the vortex polarizer, perform transformations on the light based on polarization, and transmit the light to an eye of a viewer. As such, the vortex polarizer improves the efficiency of optical coupling between the small lighting sources emitting light having azimuthal polarization and the multifocal structure.

System Overview

Figure 1:
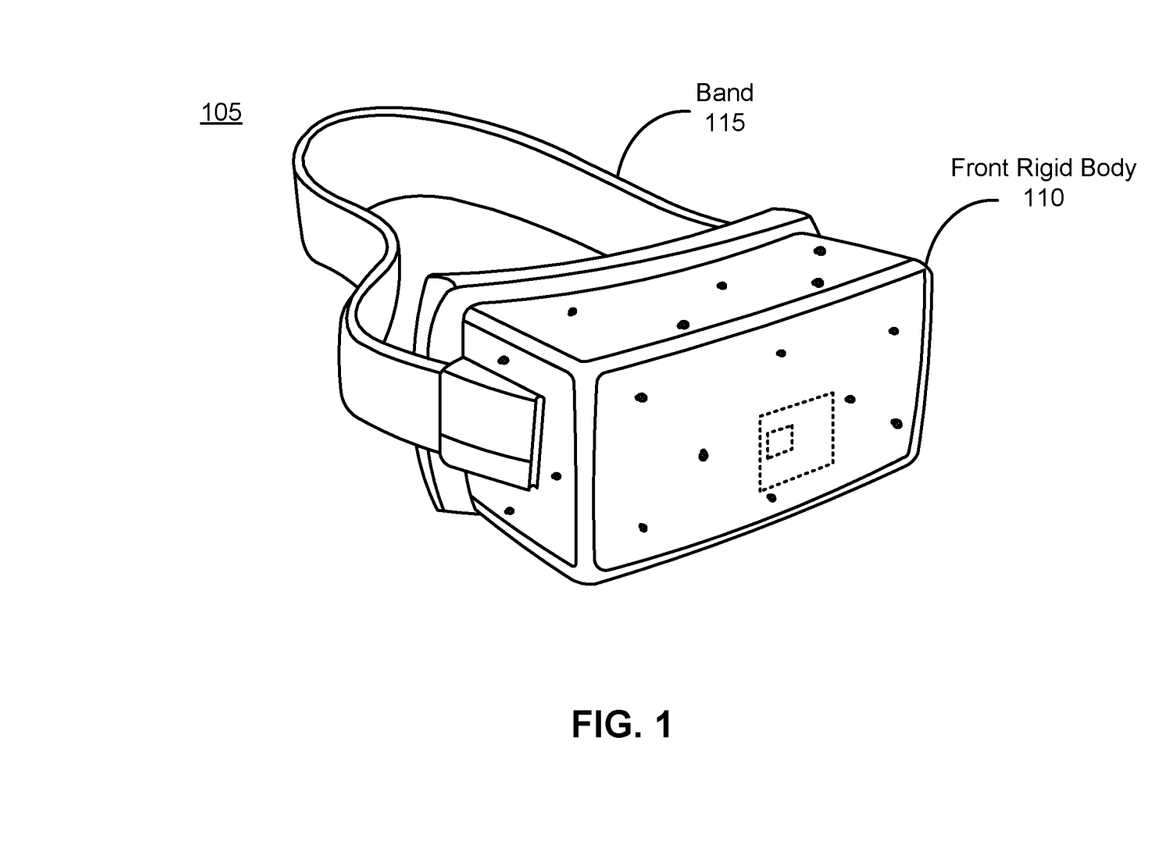
FIG. 1 is a perspective view of a head-mounted display (HMD), in accordance with one embodiment.

FIG. 1 shows a head-mounted display (HMD) 105, in accordance with one embodiment. The HMD 105 includes a front rigid body 110 and a band 115. The front rigid body 110 includes an electronic display (not shown), among other components, as discussed in greater detail below and shown in FIG. 2. In some embodiments, the HMD 105 includes sensors that detect user movement (e.g., head movement, eye movement, etc.), and an image is presented to a user through the electronic display according to the user movement detected. In some embodiments, the HMD 105 can be used for presenting a virtual reality, an augmented reality, or a mixed reality to a user.

Figure 2:
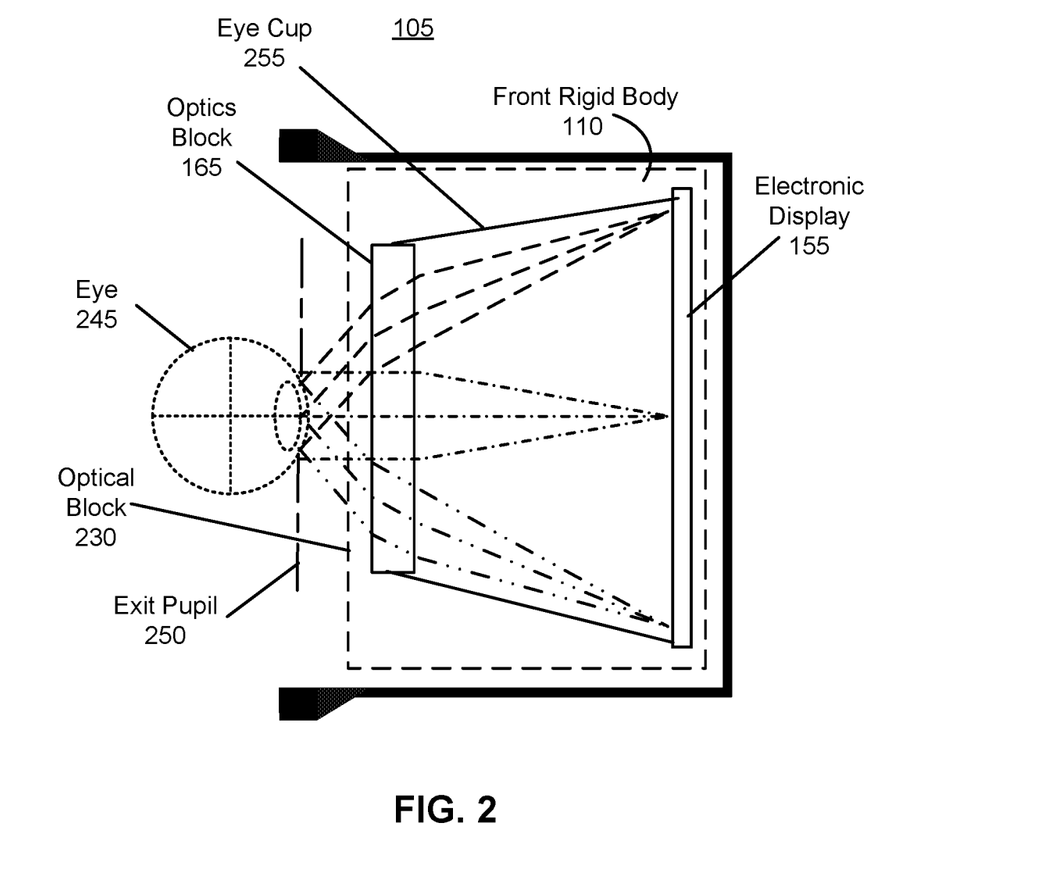
FIG. 2 is a cross sectional diagram illustrating a front rigid body of the HMD in FIG. 1, in accordance with one embodiment.

FIG. 2 is a cross sectional diagram illustrating the front rigid body 110 of the HMD 105 shown in FIG. 1. The front rigid body 110 includes an optical block 230 that provides altered image light to an exit pupil 250. The exit pupil 250 is the location in the front rigid body 110 where a user's eye 245 is positioned. For purposes of illustration, FIG. 2 shows a cross section associated with a single eye 245, but the HMD 105 may include another optical block that provides altered image light to another eye of the user.

The optical block 230 may include, among other components, an electronic display 155, an optics block 165, and an eye cup 255. The eye cup 255 is mechanically secured with the front rigid body 110, and holds the optics block 165. The electronic display 155 emits visible light toward the optics block 165.

The optics block 165 is a combination of optical components for directing the light from the electronic display 155 to the exit pupil 250 for presentation to the user. The optics block 165 can magnify the light, and in some embodiments, also corrects for one or more additional optical errors (e.g., distortion, astigmatism, etc.).

In some embodiments, the optics block 165 includes a multifocal structure of optical components that adjusts an orientation of the light emitted from the electronic display 155 such that the electronic display 155 appears at one or more particular focal distances from the user. The multifocal structure may include optical components such as a linear polarizer, a liquid crystal (LC) lens element, a partially reflective surface, a passive waveplate (e.g., half waveplate, quarter waveplate), a switchable waveplate (e.g., SHWP), a beam splitter (e.g., 50:50 beam splitter), a beam splitting polarizer (e.g., reflective linear polarizer or wire grid polarizer), a polarization rotator (e.g., a Faraday rotator), or any other suitable optical component that affects the image light emitted from the electronic display 155.

In some embodiments, the optics block 165 and the eye cup 255 may be omitted from the optical block 230.

Figure 3:
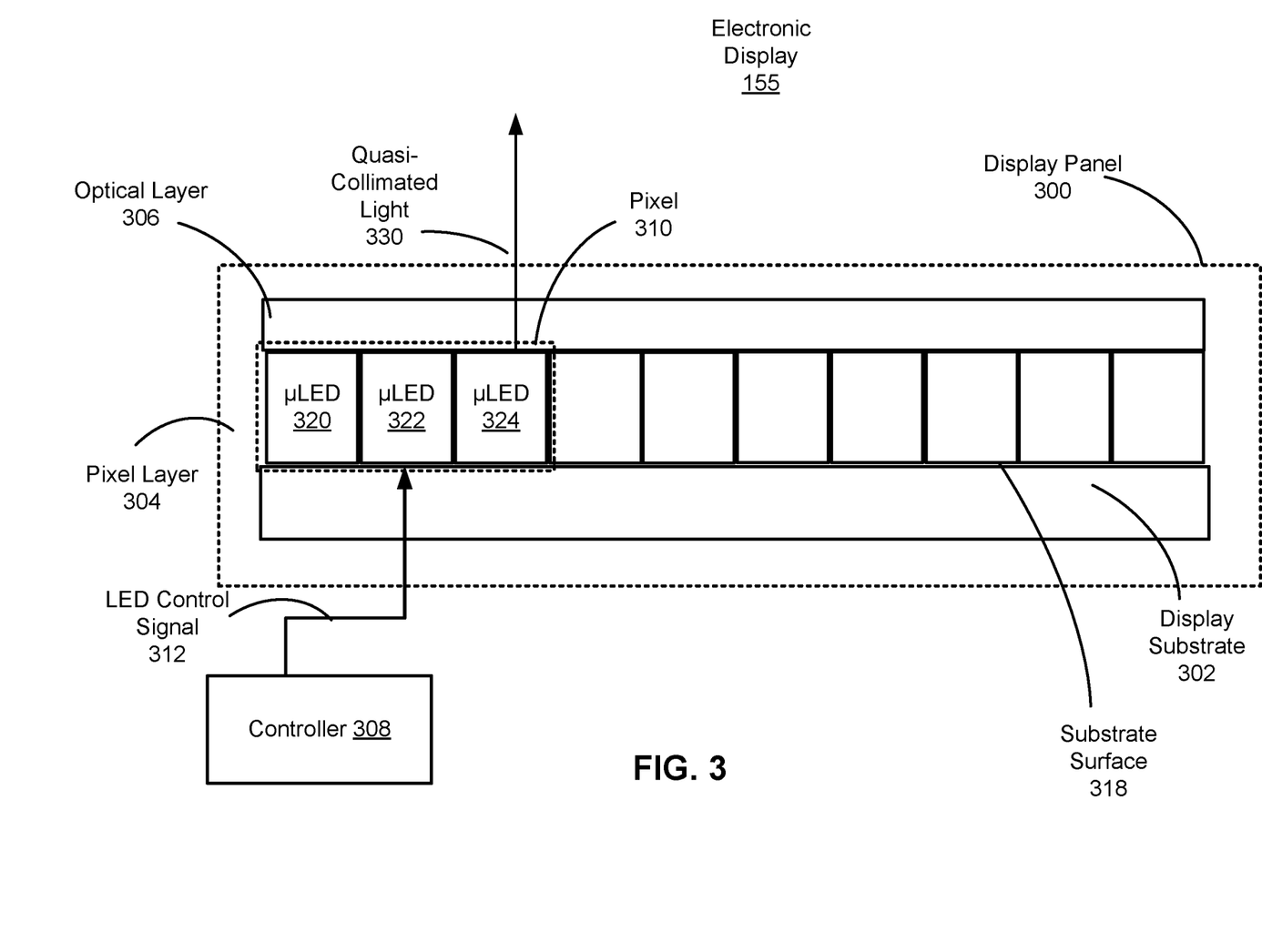
FIG. 3 is a cross sectional diagram of an electronic display in the HMD, in accordance with one embodiment.

FIG. 3 is a cross sectional diagram of an electronic display 155 in the HMD 105, in accordance with one embodiment. The electronic display 155 includes a display panel 300 and a controller 308. The display panel 300 may include, among other components, a display substrate 302 (or "substrate 302"), a pixel layer 304, and an optical layer 306. The pixel layer 304 includes an array of pixels 310 that are positioned on the surface 318 of the display substrate 302. The pixels 310 of the pixel layer 304 emit light to provide images to the viewer. The display substrate 302 provides structural support for various components (e.g., pixels and data/gate lines). The display substrate 302 may also provide electrical connections between the sub-pixel components of the pixels 310 and the controller 308. The display substrate 302 may be flexible substrate such as polymer or a rigid substrate such as a Thin Film Transistor (TFT) glass substrate.

Figure 4:
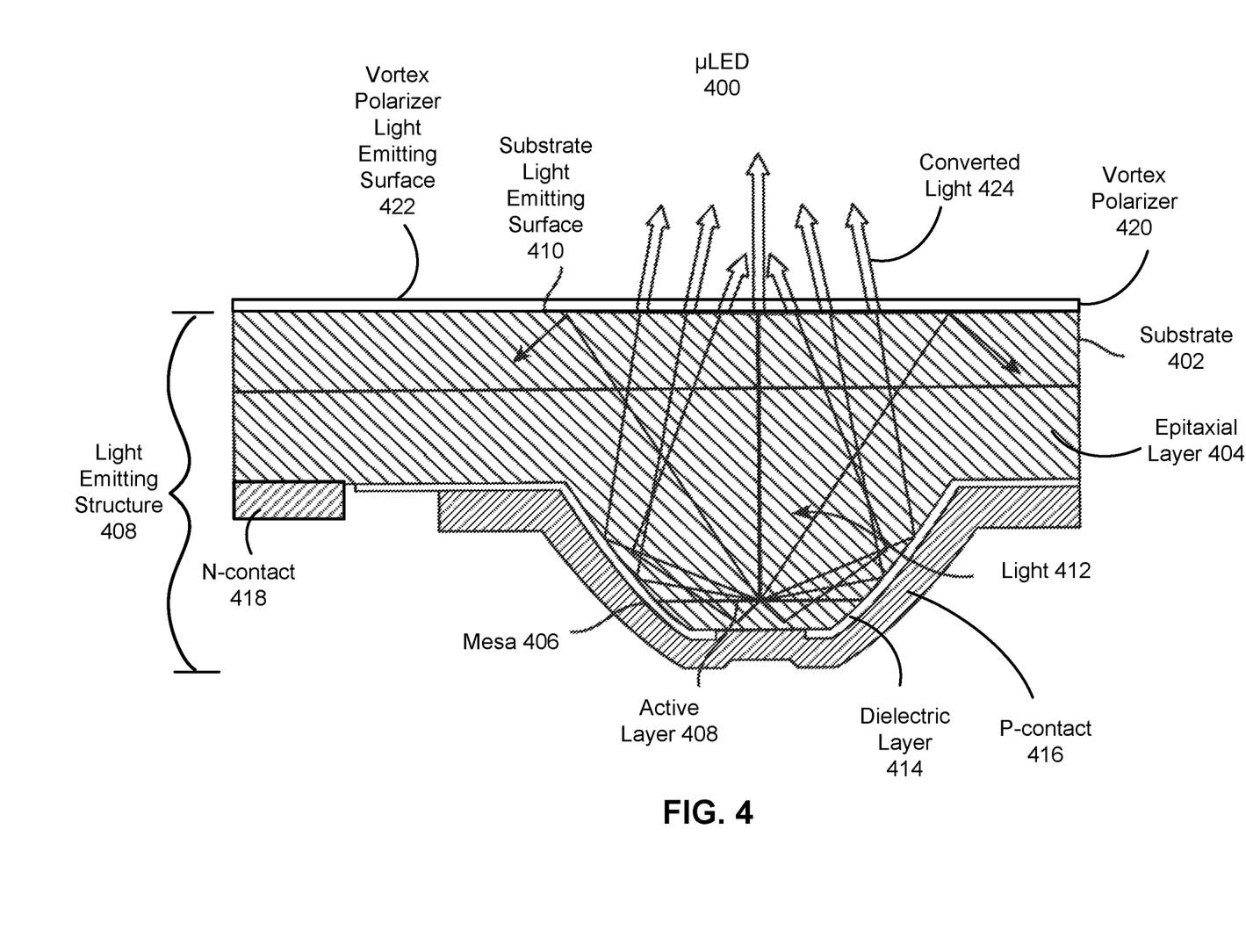
FIG. 4 is a schematic cross section of a μLED in the electronic display of FIG. 3, in accordance with one embodiment.

The pixel layer 304 may include, among other components, the sub-pixel components of the pixels 310. For example, the pixel 310 may include one or more light sources, such as µLEDs 320, 322, and 325. An example of a µLED is shown in FIG. 4 and discussed in greater detail below.

The sub-pixel components are positioned on the display substrate 302 adjacent to each other to form a matrix of pixels 310. The light sources may emit color light propagating away from the surface 318 of the substrate 302. In some embodiments, each pixel 310 includes multiple LEDs, such as one or more red LEDs, one or more green LEDs, and one or more blue LEDs. In some embodiments, a pixel 310 can include multiple LEDs of a particular color to provide a uniform light intensity for each color of light emitted from the pixel 310.

In some embodiments, such as when the lighting sources of the display panel 300 include µLEDs, the µLEDs emit a quasi-collimated light 330 having a linear polarization. The optics block 165 (as shown in FIG. 2) is positioned to receive the quasi-collimated light 330 emitted from the µLEDs.

The lighting sources of the pixel layer 304 may be fabricated separately and then bonded to the surface 318 of the display substrate 302. For example, the µLEDs may be fabricated on a native substrate, singulated, and then transferred to the display substrate 302 to form the pixel layer 304. The µLEDs may be positioned on the substrate surface 318, and then bonded to form electrical connections with the display substrate 302 (e.g., a TFT layer).

In some embodiments, different types of lighting sources may be positioned and bonded to the display substrate 302 in separate bonding cycles. In each bonding cycle, a subset of sub-pixel components for multiple pixels may be picked up from a native substrate or intermediate carrier substrate, placed (e.g., in parallel) onto the display substrate 302, and then electrically bonded with the display substrate via electrical contacts. For example, an (e.g., 2 dimensional) array of red LEDs (for multiple pixels) are first positioned and bonded on the display substrate 302, and then an array of blue LEDs are positioned and bonded on the display substrate 302, and then an array of green LEDs are positioned and bonded on the display substrate 302.

The controller 308 is a circuitry that controls the light emission from the µLEDs 320-324 (or other type of lighting sources) via a LED control signal 312.

The optical layer 306 may be disposed on top of the pixel layer 304. The optical layer 306 may include one or more optical elements that transmit the quasi-collimated light 330 having the linear polarization. The optical layer 306 may include brightness enhancement films (BEFs), diffusers, polarizers, etc. The optical layer 306 can change characteristics of the light passed through the optical layer 306, such as to improve the efficiency of light extraction from the display panel. The optical layer 306 may also provide structural protection for the components of the pixel layer 304. The optical layer 306 also preserves the linear polarization of the quasi-collimated light 330 emitted from the µLEDs. In some embodiments, the optical layer 306 rotates the orientation of the linearly polarized light emitted from the μLEDs while preserving the linear polarization of the light.

FIG. 4 shows a schematic cross section of a μLED 400, in accordance with one embodiment. A "μLED," or "MicroLED," described herein refers to a particular type of LED having a small active light emitting area (e.g., less than 2,000 μm$^2$), and collimated light output. The collimated light output increases the brightness level of light emitted from the small active light emitting area. The μLED 400 is an example of a lighting source positioned on the surface 318 of the display substrate 302 to emit the quasi-collimated light 330 having linear polarization.

The μLED 400 may include a light emitting structure 408 and a vortex polarizer 420. The light emitting structure 408 generates and emits a non-linearly polarized (e.g., azimuthally polarized) light 412 from a substrate light emitting surface 410. The vortex polarizer 420 is positioned on the light emitting surface 410, and converts the light 412 into a converted light 424 having a linear polarization. The light 424 having linear polarization is emitted from the vortex polarizer emitting surface 422 of the vortex polarizer 420.

The light emitting structure 408 may include, among other components, a LED substrate 402 (or "substrate 402") with a semiconductor epitaxial layer 404 disposed on the substrate 402, a dielectric layer 414 disposed on the epitaxial layer 404, a p-contact 416 disposed on the dielectric layer 414, and an n-contact 418 disposed on the epitaxial layer 404. The epitaxial layer 404 is shaped into a mesa 406. An active (or light emitting) layer 408 (or "active light emitting area") is included in the structure of the mesa 406.

The mesa 406 has a truncated top, on a side opposed to a substrate light emitting surface 410 of the substrate 402. The mesa 406 also has a near-parabolic shape to form a reflective enclosure for light generated within the μLED 400. The arrows show how light 412 emitted from the active layer 408 is reflected off the internal walls of the mesa 406 toward the light emitting surface 410 at an angle sufficient for the light to escape the μLED device 400 (i.e., within an angle of total internal reflection). The p-contact 416 and the n-contact 418 connect the μLED 400 to the display substrate 302.

The parabolic shaped structure of the μLED 400 results in an increase in the extraction efficiency of the μLED 400 into low illumination angles when compared to unshaped or standard LEDs. Standard LED dies generally provide an emission full width half maximum (FWHM) angle of 120°. This is dictated by the Lambertian reflectance from a diffuse surface. In comparison the μLED 400 can be designed to provide controlled emission angle FWHM of less than standard LED dies, such as around 60°. This increased efficiency and collimated output of the μLED 400 can produce light visible to the human eye with only nano-amps of drive current.

The μLED 400 may include an active light emitting area that is less than standard inorganic light emitting diodes (ILEDs), such as less than 2,000 μm$^2$. The μLED 400 directionalizes the light output from the active light emitting area and increases the brightness level of the light output. The μLED 400 may be less than 50 μm in diameter with a parabolic structure (or a similar structure) etched directly onto the LED die during the wafer processing steps to form the quasi-collimated light 412 emerging from the substrate light emitting surface 410.

As used herein, "directionalized light" refers collimated and quasi-collimated light. For example, directionalized light may be light that is emitted from a light generating region of a LED and at least a portion of the emitted light is directed into a beam having a half angle. This may increase the brightness of the LED in the direction of the beam of light.

A μLED 400 may include a circular cross section when cut along a horizontal plane as shown in FIG. 4. A μLED 400 may have a parabolic structure etched directly onto the LED die during the wafer processing steps. The parabolic structure may include a light emitting region of the μLED 400 to generate light, and the parabolic structure reflects a portion of the generated light to form the quasi-collimated light 412 emitted from the substrate light emitting surface 410.

Although the vortex polarizer 420 is shown as being formed on the light emitting structure 408 that generates quasi-collimated light having azimuthal polarization, in other embodiments, a vortex polarizer may be positioned to received light from other types of light emitting structures (and/or having other types of polarization) and convert the light into linearly polarized light.

Figure 5:
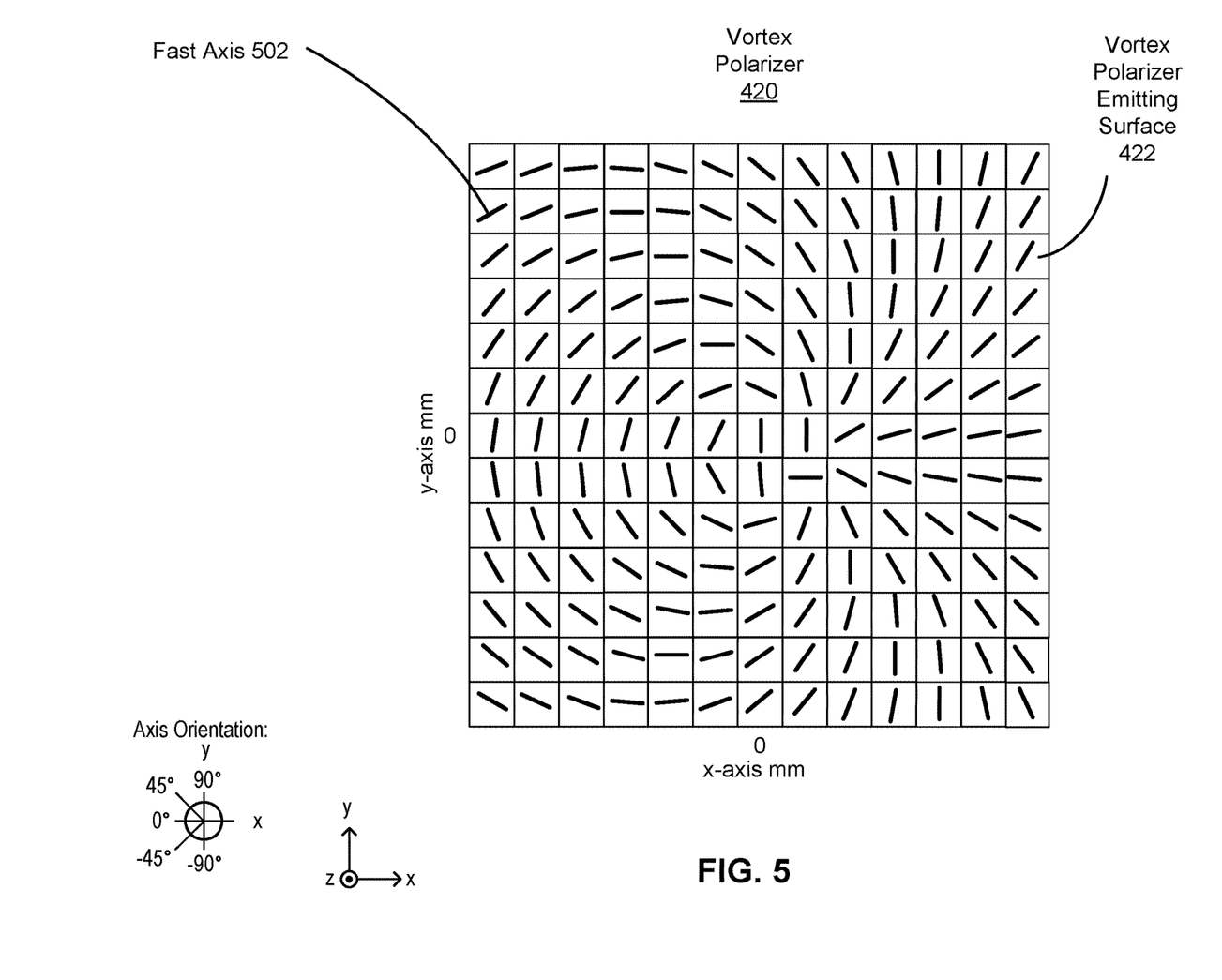
FIG. 5 is a schematic diagram illustrating a vortex polarizer, in accordance with one embodiment.

FIG. 5 is a schematic diagram illustrating a top view of a vortex polarizer 420, in accordance with one embodiment. The vortex polarizer 420 receives incident light from the light emitting structure 408 having an azimuthal polarization, converts the light having azimuthal polarization into converted light having linear polarization, and transmits the converted light outwards from the vortex polarizer light emitting surface 422. The vortex polarizer 420 has a distribution of fast axes 502 defined across the vortex polarizer emitting surface 422. The fast axes 502 vary as a function of azimuth angle across the vortex polarizer emitting surface 422.

Each of fast axes 502 receives a portion of incident light 412 having azimuthal polarization from the light emitting structure 408 and rotates the light into portion of the converted light 424 having linear polarization. Each fast axis 502 rotates the portion of the light 412 having the azimuthal polarization based on an angle defined between the fast axis 502 and an axis of orientation of the light 412 having azimuthal polarization. In particular, the fast axes 502 of the vortex polarizer 420 vary as a function of azimuth angle. In FIG. 5, the fast axes vary between around −90 degrees and +90 degrees.

Each fast axis 502 may act as a half wave retarder. Each fast axis 502 rotates the polarization orientation of the incoming light beam, with the rotation angle depending on the angle between the fast axis 502 and the orientation angle of the incoming beam polarization state. Thus, by varying the orientation of the fast axes 502 as a function of azimuth angle, azimuthally polarized light emitted from the light emitting structure 408 is converted into linearly polarized light.

The vortex polarizer 420 may include a layer of photoalignment liquid crystals aligned that define the distribution of fast axes 502. The alignment of the liquid crystals may be achieved using a laser alignment process, as discussed in greater detail below in connection with FIGS. 7 and 8.

Figure 6:
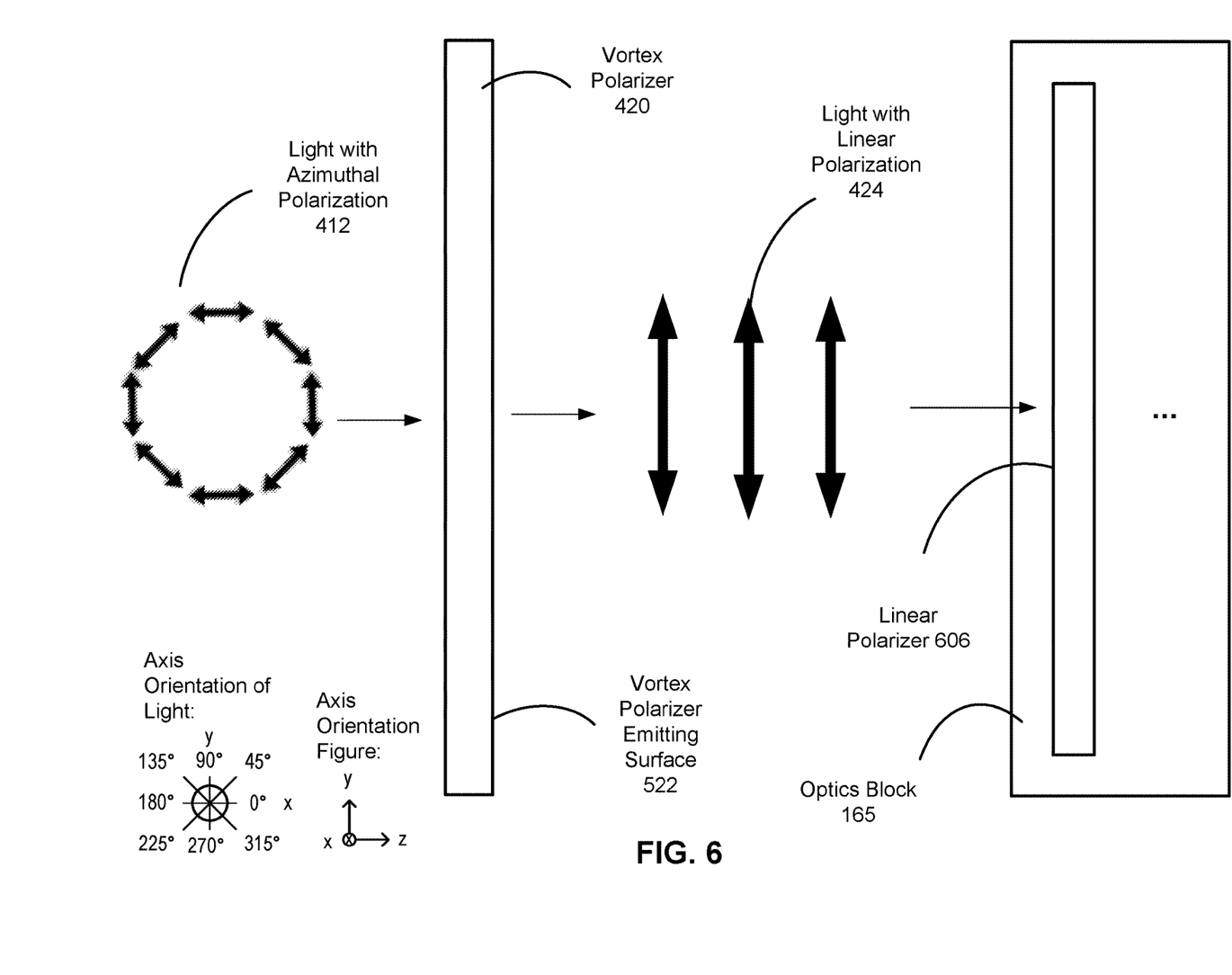
FIG. 6 is a diagram illustrating a conversion of light from azimuthal polarization to linear polarization by a vortex polarizer, in accordance with one embodiment.

FIG. 6 is a diagram illustrating a conversion of light from azimuthal polarization to linear polarization by a vortex polarizer 420, in accordance with one embodiment. As discussed above, the light emitting structure 408 emits the light 412 having azimuthal polarization, which is transmitted through the vortex polarizer 420 and converted into light 424 having linear polarization. In FIG. 6, the light 424 has linear polarization with an electric field component aligned along 90 degrees. The light 424 is transmitted to the optics block 165. The optics block 165 includes one or more optical components as discussed above. The optical components may be arranged in a sequence, with a linear polarizer 606 positioned to receive the linearly polarized light 424.

The linear polarizer 606 linearly polarizes light in accordance with the orientation of its polarization axis. For example, the linear polarizer 606 transmits linearly polarized light having an electric field component aligned along the polarization axis, and reflects linearly polarized light having an electric field component aligned with a 90 degrees offset from the polarization axis. To optimize the optical coupling between the light emitted from the vortex polarizer 420 (and thus the electronic display 155) and the optics block 165, the incident light 424 should be (e.g., fully) transmitted by the linear polarizer 606. As such, the linear polarization axis of the linear polarizer 606 may be aligned with the orientation of the electric field component of the linearly polarized light 424. For example, if the light 424 is linearly polarized with an orientation aligned along 90 degrees, than the polarization axis of the linear polarizer 606 may also be aligned along 90 degrees. Here, the linear polarizer 606 transmits linearly polarized light oriented along 90 degrees and reflects linearly polarized light oriented along 0 degrees. Without the vortex polarizer 420, the light 412 having azimuthal polarization would be transmitted to the linear polarizer 606, and a portion of the light 412 would be reflected by the linear polarizer 606. Thus the vortex polarizer 420 can improve optical coupling between a light emitting structure emitting quasi-collimated light from a small light emitting area with azimuthal polarization, such as the light emitting structure 408 of the μLED 400, and an optical component that is configured for optimal optical coupling with light having linear polarization. In some embodiments, the linearly polarized light from the vortex polarizer 420 is converted into other polarizations. For example, a circular polarization can be achieved by passing the linearly polarized light through quarter wave plate.

Figure 7:
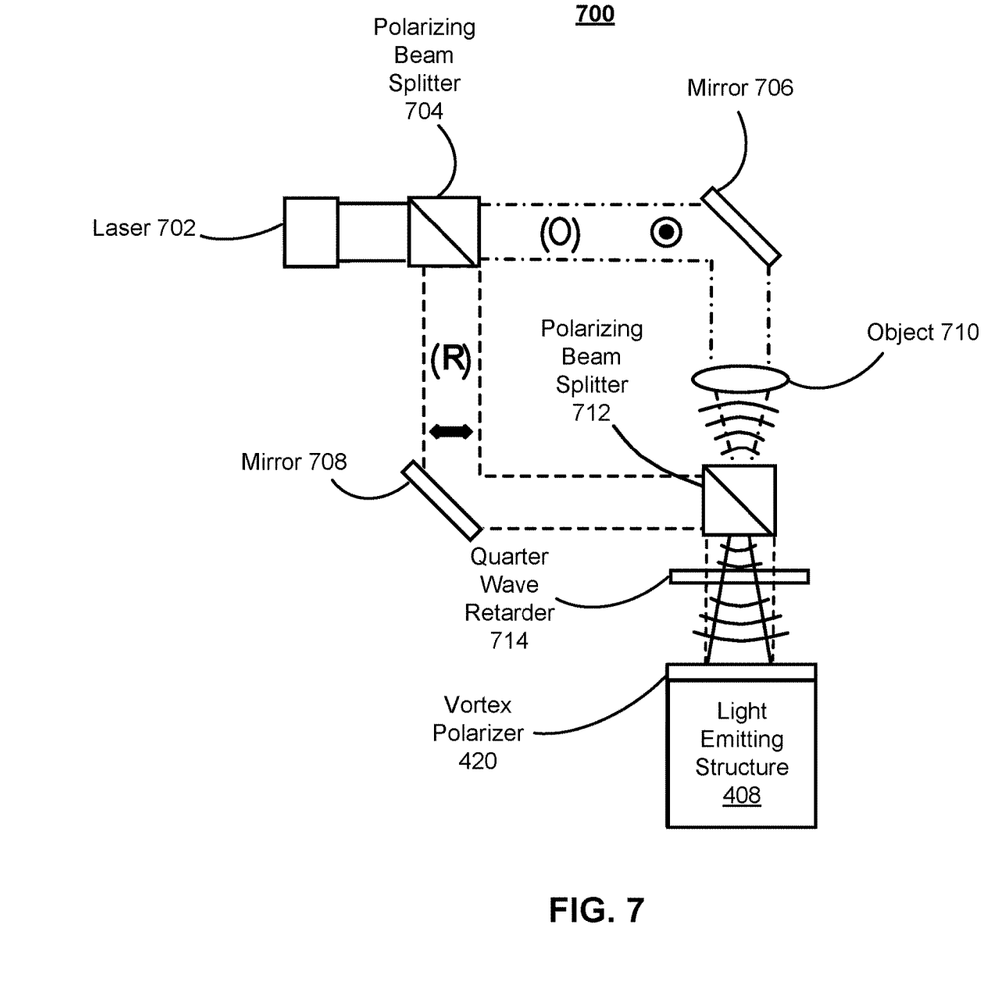
FIG. 7 is a schematic diagram illustrating a laser interferometry system for manufacturing a vortex polarizer using linear photoalignment polymer (LPP) alignment, in accordance with one embodiment.

FIG. 7 is a schematic diagram illustrating a laser interferometry system 700 for manufacturing a vortex polarizer 420 using linear photoalignment polymer (LPP) alignment, in accordance with one embodiment. The system 700 can be used to form the distribution of fast axes 502 of the vortex polarizer 420 as shown in FIG. 5.

The system 700 includes a laser 702, a polarizing beam splitter (PBS) 704, a mirror 706, a mirror 708, an object 710, a PBS 712, and a quarter wave retarder 714. To form the vortex polarizer 420, a photo-alignment liquid crystal (LC) material 716 is deposited on the light emitting surface of the light emitting structure 408. The photo-alignment LC material 716 may include a layer of polymerizable liquid crystal (LC) 718 and a layer of LPP 720. Next, the system 700 performs a laser alignment on the LPP 720 to form the fast axes 502 of the vortex polarizer 420.

The laser 702 generates a laser beam that is separated into a reference (R) beam and an object (O) beam by the PBS 704. The reference beam R and object beam O have orthogonal linear polarizations. The reference beam R is reflected by the mirror 708 to shine onto the LPP 720 of the photo-alignment liquid crystal material 716 without any modification. The object beam O is reflected by the mirror 706 toward the object 710 inserted in the optical path, and modified by the object 710. The reference beam R and object beam O are recombined by the PBS 712. The quarter wave retarder 714 transforms the orthogonal linear polarizations of the reference beam R and the object beam O into orthogonal circular polarizations.

An interference pattern created by the overlapping of object beam O and the reference beam R leads to a spatial distribution of polarization orientation on LPP 720. This pattern is recorded by the LLP 720 to create the fast axis 502 orientation distribution as shown in FIG. 5.

Figure 8:
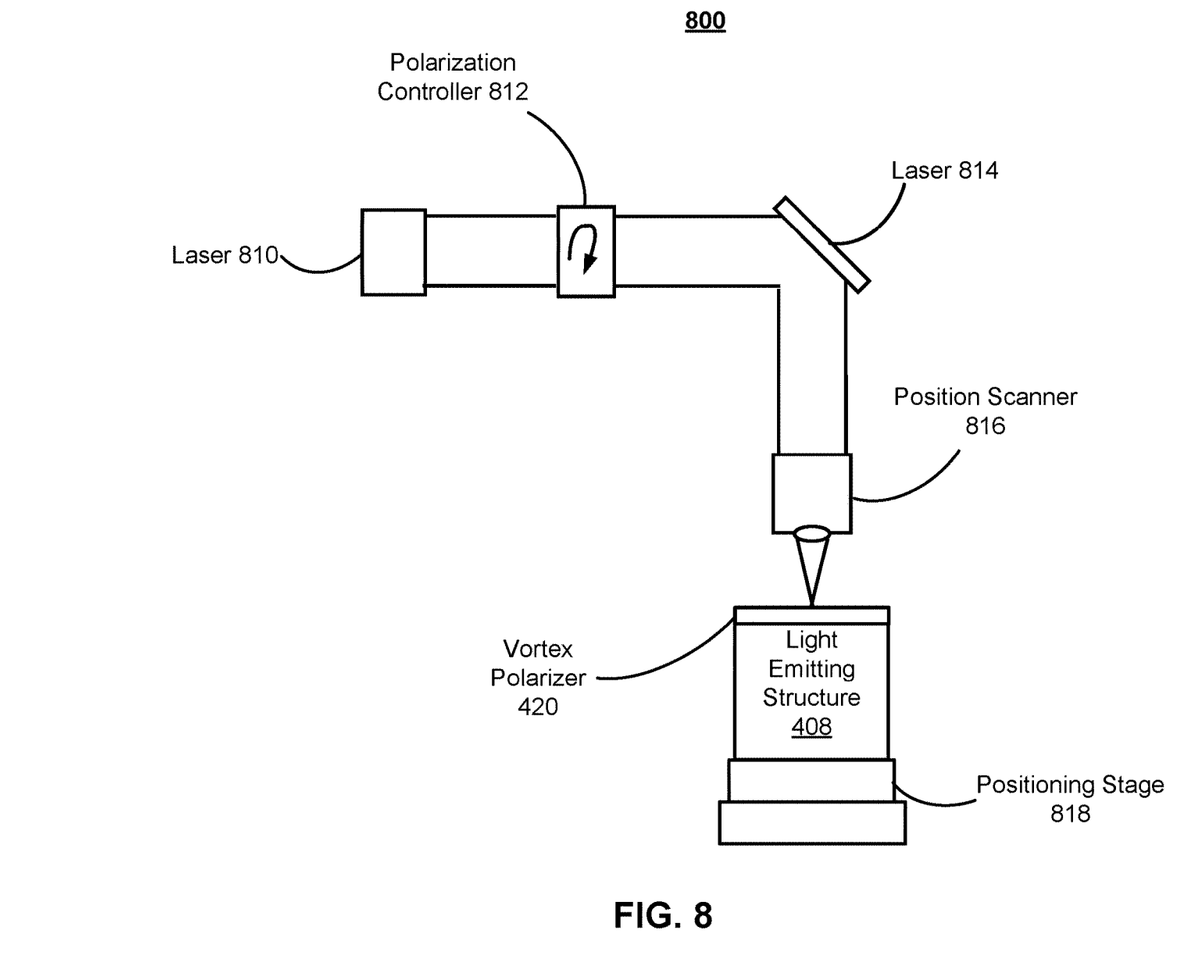
FIG. 8 is a schematic diagram illustrating a laser direct writing system for manufacturing a vortex polarizer using LPP alignment, in accordance with one embodiment.

FIG. 8 is a schematic diagram illustrating a laser direct writing system 800 for manufacturing a vortex polarizer 420 using LPP alignment, in accordance with one embodiment. The system 800 is another example of a system that can be used to form the distribution of fast axes 502 of the vortex polarizer 420 as shown in FIG. 5.

The system 800 includes a laser 810, a polarization controller 812, a mirror 814, a position scanner 816, and a positioning stage 818. To form the vortex polarizer 420, a photo-alignment liquid crystal (LC) material 820 is deposited on the light emitting surface of the light emitting structure 408. The photo-alignment LC material 820 may include a layer of polymerizable liquid crystal (LC) 822 and a layer of linear photoalignment polymer (LPP) 824.

The laser 810 emits a beam having polarization as controlled by the polarization controller 812. The beam is reflected off the mirror 814. A position scanner 816 further focuses the laser onto the surface of the LPP with a positioning stage 818. The positioning stage 818 is a 2-D positioning stage. The LPP responds to the polarization state as well as the intensity of the laser beam to record the polarization orientation of the laser beam at the focal point. By controlling the polarization orientation of the laser beam with the polarization controller 812, a fast axis 502 can be recorded.

Figure 9:
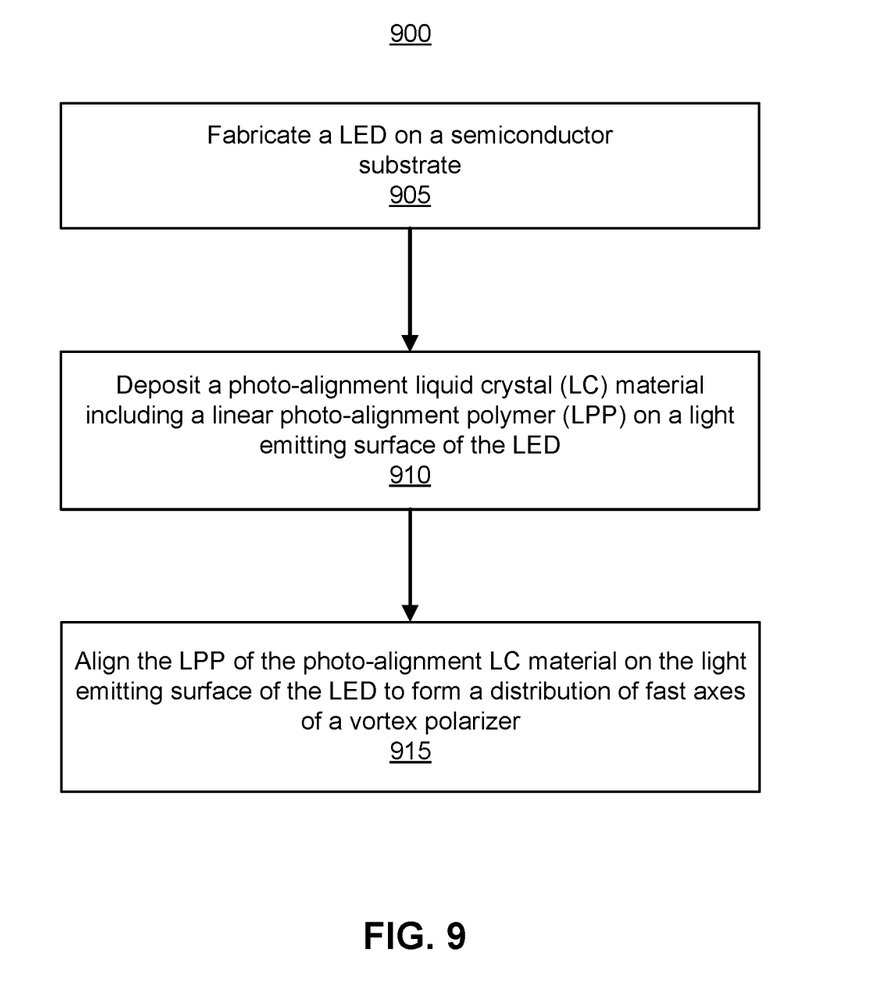
FIG. 9 is a flow chart illustrating a process for manufacturing a vortex polarizer using LPP alignment, in accordance with one embodiment.

FIG. 9 is a flow chart illustrating a process 900 for manufacturing a vortex polarizer using linear photoalignment polymer (LPP) alignment, in accordance with one embodiment. Process 900 can be used to manufacture a one or more LEDs, such as μLED 400, having a light emitting surface that emits light having azimuthal polarization, and a vortex polarizer on the light emitting surface that converts the light into converted light having linear polarization.

A LED is fabricated 905 on a semiconductor substrate. For example, an array of μLEDs 400 may be fabricated on a substrate. The array of μLEDs 400 include an array of light emitting surfaces 410 that emit light having azimuthal polarization.

A photo-alignment LC material is deposited 910 on the light emitting surface of the LED. The photo-alignment LC material may include a layer of polymerizable LC 718 on top of a layer of LPP 720, as shown FIG. 7 for the photo-alignment LC material 716.

Prior to singulation of an array of LEDs into individual dies, the light emitting surfaces 410 of the LEDs are not separated and form a single substrate surface. A single layer of photo-alignment LC material may be deposited on the substrate surface prior to singulation of the LEDs. In other embodiments, the LEDs are singulated and prior to deposition of the photo-alignment LC material on individual light emitting surfaces. The singulated LEDs may be kept on the native substrate, or transferred elsewhere. For example, the singulated LEDs may be transferred to an intermediate carrier substrate, or a display substrate 302 of an electronic display 155. Thus the photo-alignment LC material may be deposited 910 on the light emitting surface of the LED at various stages of manufacture of the LEDs, or assembly of the electronic display 155.

A system aligns 915 the LPP of the photo-alignment LC material on the light emitting surface of the LED to form a distribution of fast axes of a vortex polarizer. An example distribution of fast axes 502 is shown in FIG. 5 for the vortex polarizer 420. The alignment may be performed by the laser interferometry system 700 as shown in FIG. 7 or the laser direct writing system as shown in FIG. 8.

Using the laser interferometry system 700, an interference pattern created by the overlapping of object beam O and the reference beam R leads to a spatial distribution of polarization orientation on LPP, thereby forming the distribution of the fast axes 502 of the vortex polarizer 420. Using the direct writing system 800, the distribution of fast axes 502 are recorded by controlling polarization state as well as the intensity of the laser beam. For example, a first fast axis 502 is recorded with the polarization controller setting the polarization orientation of the laser to a first orientation. After the first axis is recorded, the positioning stage moves the material 820 to record another fast axis 502 with the polarization controller 812 set to another polarization orientation. This process is repeated until the distribution of fast axes of the vortex polarizer 420 has been formed.

The foregoing description of the embodiments has been presented for the purpose of illustration; it is not intended to be exhaustive or to limit the patent rights to the precise forms disclosed. Persons skilled in the relevant art can appreciate that many modifications and variations are possible in light of the above disclosure.

The language used in the specification has been principally selected for readability and instructional purposes, and it may not have been selected to delineate or circumscribe the inventive subject matter. It is therefore intended that the scope of the patent rights be limited not by this detailed description, but rather by any claims that issue on an application based hereon. Accordingly, the disclosure of the embodiments is intended to be illustrative, but not limiting, of the scope of the patent rights, which is set forth in the following claims.

What is claimed is:

1. A light emitting device, comprising:
    a substrate including a light emitting surface;
    an epitaxial layer disposed on another surface of the substrate at an opposite side of the light emitting surface, at least a portion of the epitaxial layer shaped into a mesa structure protruding away from the light emitting surface;
    an active layer disposed in the mesa structure to emit light having azimuthal polarization to the light emitting surface, at least a portion of the light from the active layer internally reflected at the mesa structure towards the light emitting surface; and
    a vortex polarizer disposed on the light emitting surface at an opposite side of the epitaxial layer, the vortex polarizer to convert the light from the active layer to a converted light having linear polarization.

2. The light emitting device of claim 1, wherein the vortex polarizer includes a distribution of fast axes that vary as a function of azimuth angle, and each fast axis rotates a portion of the light having the azimuthal polarization to a portion of the converted light.

3. The light emitting device of claim 2, wherein each fast axis rotates the portion of the light having the azimuthal polarization based on an angle defined between the fast axis and an axis of orientation of the portion of light having azimuthal polarization.

4. The light emitting device of claim 2, wherein the vortex polarizer includes linear photoalignment polymer (LPP) aligned to define the distribution of fast axes.

5. The light emitting device of claim 4, wherein the LPP is aligned by a laser interferometry process.

6. The light emitting device of claim 4, wherein the LPP is aligned by a laser direct writing process.

7. The light emitting device of claim 1, wherein the mesa structure collimates the light generated by the active layer when the light is reflected by the mesa structure.

8. A head-mounted display (HMD), comprising:
    an electronic display, including:
        a display substrate; and
        a plurality of light emitting diodes (LEDs) disposed on the display substrate, each LED including:
            a LED substrate including a light emitting surface;
            an epitaxial layer disposed on another surface of the LED substrate at an opposite side of the light emitting surface, at least a portion of the epitaxial layer shaped into a mesa structure protruding away from the light emitting surface;
            an active layer disposed in the mesa structure to emit light having azimuthal polarization to the light emitting surface, at least a portion of the light from the active layer internally reflected at the mesa structure towards the light emitting surface; and
            a vortex polarizer disposed on the light emitting surface at an opposite side of the epitaxial layer, the vortex polarizer to convert the light from the active layer to a converted light having linear polarization.

9. The HMD of claim 8, further comprising a multifocal structure to transmit the light having the linear polarization, the multi-focal structure including a linear polarizer having a polarization axis aligned along an electric field component of the light having the linear polarization.

10. The HMD of claim 8, wherein the vortex polarizer includes a distribution of fast axes that vary as a function of azimuth angle, and each fast axis rotates a portion of the light having the azimuthal polarization to a portion of the converted light.

11. The HMD of claim 10, wherein each fast axis rotates the portion of the light having the azimuthal polarization based on an angle defined between the fast axis and an axis of orientation of the portion of light having azimuthal polarization.

12. The HMD of claim 10, wherein the vortex polarizer includes linear photoalignment polymer (LPP) aligned to define the distribution of fast axes.

13. The HMD of claim 12, wherein the LPP is aligned by a laser interferometry process.

14. The HMD of claim 12, wherein the LPP is aligned by a laser direct writing process.

15. The HMD of claim 8, wherein the mesa structure collimates the light generated by the active layer when the light is reflected by the mesa structure.

\* \* \* \* \*

UNITED STATES PATENT AND TRADEMARK OFFICE
CERTIFICATE OF CORRECTION

PATENT NO. : 10,712,579 B1
APPLICATION NO. : 16/134785
DATED : July 14, 2020
INVENTOR(S) : Christopher Percival et al.

Page 1 of 1

It is certified that error appears in the above-identified patent and that said Letters Patent is hereby corrected as shown below:

In the Claims

Column 10, Line 35, Claim 9, delete "multi-focal" and insert -- multifocal --.

Signed and Sealed this
Twenty-second Day of December, 2020

Andrei Iancu
*Director of the United States Patent and Trademark Office*